(12) United States Patent
Pickerd

(10) Patent No.: US 6,915,218 B2
(45) Date of Patent: Jul. 5, 2005

(54) METHOD OF CONSTRAINTS CONTROL FOR OSCILLOSCOPE TIMEBASE SUBSECTION AND DISPLAY PARAMETERS

(75) Inventor: John J. Pickerd, Hillsboro, OR (US)

(73) Assignee: Tektronix, Inc., Beaverton, OR (US)

(*) Notice: Subject to any disclaimer, the term of this patent is extended or adjusted under 35 U.S.C. 154(b) by 106 days.

(21) Appl. No.: 10/374,914

(22) Filed: Feb. 25, 2003

(65) Prior Publication Data

US 2004/0167727 A1 Aug. 26, 2004

(51) Int. Cl.$^7$ .......................... G06F 19/00; G01R 19/22
(52) U.S. Cl. ......................................... 702/57; 324/121 R
(58) Field of Search ................. 702/57, 66; 345/440.1; 324/121 R

(56) References Cited

U.S. PATENT DOCUMENTS

| | | | | |
|---|---|---|---|---|
| 4,251,814 A | * | 2/1981 | Dagostino | 345/440.1 |
| 4,975,636 A | * | 12/1990 | Desautels | 324/121 R |
| 5,081,592 A | * | 1/1992 | Jenq | 702/68 |
| 5,375,067 A | * | 12/1994 | Berchin | 702/66 |
| 5,397,981 A | * | 3/1995 | Wiggers | 324/121 R |
| 5,495,168 A | * | 2/1996 | de Vries | 324/121 R |
| 5,517,105 A | | 5/1996 | Holzwarth | |
| 5,877,621 A | * | 3/1999 | Beyers et al. | 324/121 R |
| 5,914,592 A | * | 6/1999 | Saito | 324/121 R |
| 5,978,742 A | * | 11/1999 | Pickerd | 702/66 |
| 6,111,400 A | * | 8/2000 | Foster et al. | 324/121 R |
| 6,201,384 B1 | * | 3/2001 | Alexander | 324/121 R |
| 6,466,006 B2 | * | 10/2002 | Alexander | 324/121 R |
| 6,525,525 B1 | * | 2/2003 | Azinger | 324/121 R |
| 6,753,677 B1 | * | 6/2004 | Weller et al. | 324/121 R |
| 6,760,673 B2 | * | 7/2004 | Genther et al. | 702/75 |
| 2002/0080149 A1 | | 6/2002 | Sostheim | |

FOREIGN PATENT DOCUMENTS

| EP | 0 278 163 | 8/1988 |
|---|---|---|
| EP | 1 156 338 | 11/2001 |

OTHER PUBLICATIONS

Kusayanagi et al., A 25 Ms/s 8–b–10 Ms/s 10–b CMOS Data Acquisition IC for Digital Storage Oscilloscopes, Mar. 1998, IEEE Journal of Solid–State Circuits, vol. 33, No. 3, pp. 492–496.*

* cited by examiner

Primary Examiner—John Barlow
Assistant Examiner—Toan M. Le
(74) Attorney, Agent, or Firm—Moser, Patterson & Sheridan, LLP; Thomas F. Lenihan; Francis I. Gray

(57) ABSTRACT

An apparatus and method for constraining temporal parameters associated with the acquisition and display of signals under test acquires samples of a signal under test (SUT) as corresponding sample records with each sample record having associated with it a duration parameter. Display grids cooperate with the resulting waveform imagery by either being locked to the waveform image or locked to a display frame. A controller allows a user to select a number of volts for each vertical grid segment and an amount of time for each horizontal grid segment. The duration parameter determines the length in seconds of the acquired waveform as displayed, which parameter may be changed by adjusting the timebase parameters of record length or sample rate. Therefore when displayed the number of grid lines change as the waveform is expanded or contracted (locked to waveform), or the units between grid lines change as the waveform is expanded or contracted (locked to display frame).

13 Claims, 5 Drawing Sheets

D = 10ns
t/d = 1ns/div

D = 20ns
t/d = 1ns/div

D = 20ns
t/d = 2ns/div

METHOD OF CONSTRAINTS CONTROL FOR OSCILLOSCOPE TIMEBASE SUBSECTION AND DISPLAY PARAMETERS

CROSS REFERENCE TO RELATED APPLICATIONS

This patent application is related to simultaneously filed U.S. patent application Ser. No. 10/374,416 entitled METHOD OF CONSTRAINTS CONTROL FOR OSCILLOSCOPE VERTICAL SUBSECTION AND DISPLAY PARAMETERS, which is incorporated herein by reference in its entirety.

FIELD OF THE INVENTION

The invention relates generally to signal acquisition systems and, more particularly, to a method and apparatus for providing constraint control of timebase display parameters.

BACKGROUND OF THE INVENTION

Signal acquisition devices such as digital storage oscilloscopes (DSOs) use a display grid that is fixed at eight divisions vertically by ten divisions horizontally. The eight by ten division grid is the same size as the grids initially etched into the glass of the cathode ray tube (CRT) such as provided by the earlier analog oscilloscopes. The eight by ten division grid has lingered despite the fact that most engineering applications requiring the graphing of data are not limited to an eight by ten graticule. That is, in virtually all disciplines of science, data is typically graphed with scales that provide an appearance adapted for ease of interpreting the data. One disadvantage of the current standard oscilloscope approach is that as data is zoomed on the display, the graticules are still fixed as eight by ten rather than providing a constant frame of reference to the acquired waveform parameters.

SUMMARY OF INVENTION

These and other deficiencies of the prior art are addressed by the present invention of a method and apparatus for constraining timebase parameters such as time per division, resolution, duration and display width such that data may be presented in a more useful manner (i.e., having an appropriate scale and/or graticule for ease of data interpretation) and reducing the constraints that are currently placed upon timebase parameters of record length and sample rate when they are controlled according to constraints of time per division, resolution, duration and display width. The invention also advantageously simplifies the design and maintenance of timebases.

An apparatus according to one embodiment of the invention comprises: a signal acquisition device, for sampling a signal under test (SUT) at a sample rate S to form thereby a stream of acquired samples; a memory, for storing sequences of the acquired samples as corresponding sample records, each sample record having associated with it a duration parameter; and a controller, for generating a display signal suitable for use by a display device and including waveform imagery visually cooperating with temporal segment delineators; the controller, in a first mode of operation, adapting a number of temporal segment delineators in response to the duration parameter.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be described within the context of a signal acquisition device such as a digital signal oscilloscope (DSO). However, it will be appreciated that the subject invention has applicability to other signal acquisition devices and, more particularly, those signal acquisition devices or display devices providing time-based display of acquired data or other information.

The invention enables the management of timebase parameters in conjunction with display parameters in a manner facilitating both control and ease of use. The invention as applied to, for example, a DSO enables more intuitive user interaction and simplified maintenance and design of the DSO.

The invention implements a time per division control system which operates differently in each of two modes. In a first mode, the display grids are locked to the waveform. In a second mode, the display grids are locked to the display frame.

Figure 1:
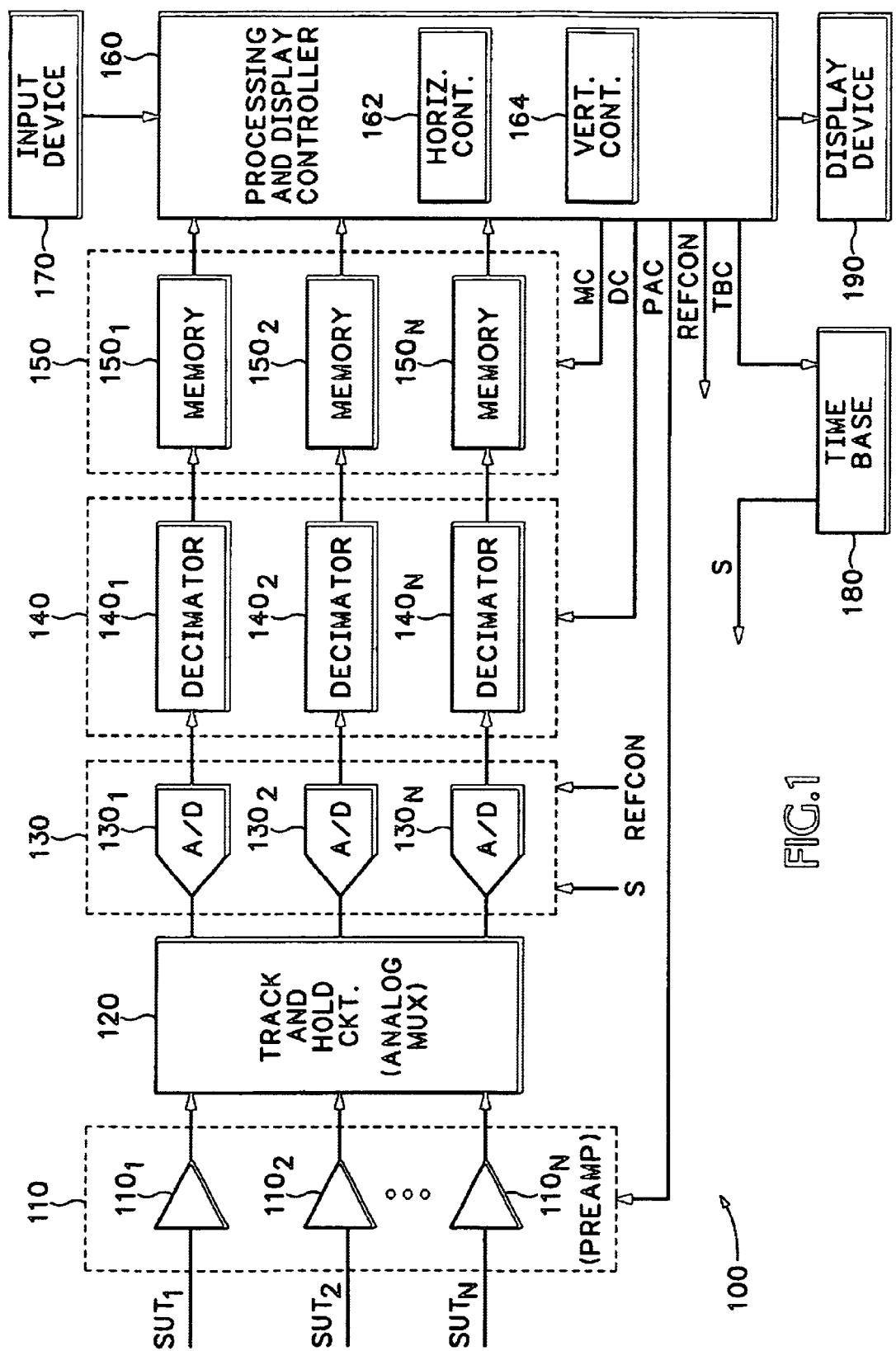
FIG. 1 depicts a high level block diagram of a signal acquisition system according to an embodiment of the present invention.

FIG. 1 depicts a high level block diagram of a signal acquisition system according to an embodiment of the present invention. Specifically, the system 100 of FIG. 1 receives a plurality of input signals under test (SUT) denoted as signals under test $SUT_1$–$SUT_N$ (collectively signals under test SUT).

The system 100 of FIG. 1 comprises a plurality of preliminary amplifiers $110_1$–$110_N$ (collectively preliminary amplifiers 110), a track and hold circuit 120, a plurality of analog-to-digital (A/D) converters $130_1$–$130_N$ (collectively A/D converters 130), a plurality of decimators $140_1$–$140_N$ (collectively decimators 140), a plurality of acquisition memories $150_1$ $150_N$ (collectively acquisition memory 150), a processing and display controller 160, an input device 170, a timebase 180 and a display device 190. It is noted that the system 100 of FIG. 1 implements N input channels, where N is an integer, though a single channel may also be implemented within the context of the present invention.

Each of N input channels receives a respective signal under test SUT, which SUT is then amplified by a respective preamp 110 and processed by the track and hold circuit 120. The track and hold circuit 120, illustratively an analog multiplexer, holds each SUT steady for a period of time sufficient to enable acquisition by a respective A/D converter 130.

The preamps 110 are responsive to a preamp control signal PAC provided by the processing and display controller 160 to perform any or all of an attenuation function, an amplification function, a range adjust function and a range offset function. In one mode of operation, the preamp control signal PAC causes the preamps 110 to amplify their respective signals under test to levels sufficient to utilize substantially all of the dynamic range of their corresponding A/D converters. In other modes of operation, such as discussed in more detail below with respect to the vertical control aspects of the present invention, the preamps 110 are caused to amplify their respective signals under test to normalize or otherwise conform subsequent acquired sample streams to a desired vertical parameter.

The A/D converters 130 receive and digitize their respective signals under test in response to a sample clock signal S produced by the timebase 180 to produce thereby respective sample streams. The sample clock signal S is preferably a clock signal adapted to cause the A/D converters 130 to operate at a maximum sampling rate, though other sampling rates may be selected. The timebase 180 is responsive to a timebase control signal TBC produced by the controller 160 to change frequency and/or pulse width parameters associated with the sample clock signal S. Optionally, the A/D converters 130 include a controllable voltage reference source (not shown) that produces a voltage reference used by the A/D converter 130 to establish the full scale voltage range of the input signal range (i.e., the voltage level of the signal provided by the preamp 110 causing a maximum digital output from the A/D converter). The controllable voltage reference source is controlled by a signal REFCON produced by the processing and display controller 160.

The sample streams produced by the A/D converters 130 are coupled to respective decimators 140. Each decimator 140 processes its received digitized signal under test according to a respective processing algorithm or decimation mode, such as a sub-sampling mode, a peak detection mode (e.g., min-max detection), a high resolution mode (e.g., a box-car averaging mode) or other mathematical function, algorithm or mode. The mode of operation of each decimator 140 may be preprogrammed such as with an application specific integrated circuit (ASIC) or field programmable gate array (FPGA), or may be programmed "on the fly" in response to a decimator control signal DC produced by the processing and display controller 160. The decimators 140 may utilize different respective functions, the same respective functions or a combination thereof.

The decimators 140 process respective received sample streams to produce respective decimated sample streams in response to respective received sample streams. For example, in response to receiving a digital sample stream from first A/D converter 1301, first decimator 140, produces a corresponding decimated sample stream. The decimated sample streams produced by the decimators 140 are stored in corresponding portions of acquisition memory 150. The acquisition memory 150 may be a contiguous or non-contiguous memory and may, optionally, allocate respective portions to the respective decimators 140.

The processing and display controller 160 is used to manage the various operations of the signal acquisition system 100. The processing and display controller 160 performs various processing and analysis operations on the data samples stored within the acquisition memory 150. An embodiment of the processing and display controller 160 will be described in more detail below with respect to FIG. 2.

The processing and display controller 160 receives user commands via the input device 170, illustratively a keypad or pointing device. The processing and display controller 160 provides image-related data to the display device 190, illustratively a cathode ray tube (CRT), liquid crystal display (LCD) or other display device. The display device 190 may also comprises a touch screen device such that the display device 190 provides both user input and user output functionality. This touch screen embodiment is especially useful within the context of user interface functionality described in more detail below.

The processing and display controller 160 includes a horizontal control function 162 and a vertical control function 164. The horizontal control function 162 adapts and/or constrains horizontal display parameters (i.e., signal time parameters) of waveforms presented via the display device 190. The vertical control function 164 adapts and/or constrains vertical display parameters (i.e., signal amplitude parameters) of waveforms presented via the display device 190. The horizontal and vertical control functions will be discussed in more detail below with respect to FIGS. 2–6.

Within the context of the present invention, the various operations described herein may be conceptualized as producing a display signal suitable for use by a display device wherein imagery associated with multiple layers is provided. Specifically, a waveform layer may include waveform image data, a control layer may include control image data and a grid layer may include grid image data. In one embodiment of the invention, the control and grid layer information are combined within a single layer. In another embodiment, a single image layer is used to represent all information including waveform, control and grid information.

Figure 2:
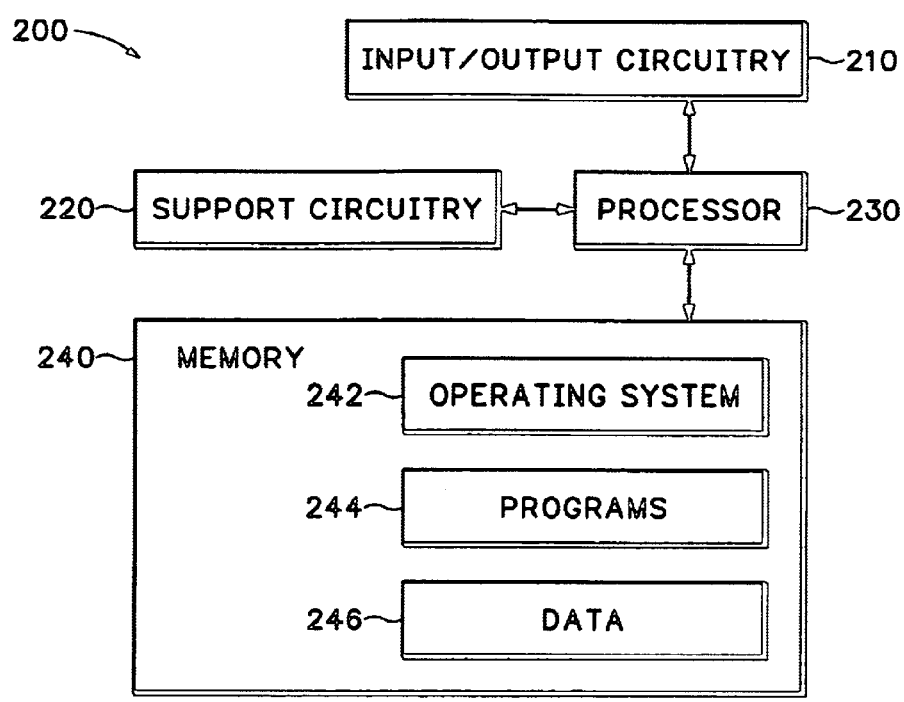
FIG. 2 depicts a high level block diagram of a processing and display controller suitable for use in the signal acquisition system of FIG. 1.

FIG. 2 depicts a high level block diagram of a controller suitable for use in the signal acquisition system 100 of FIG. 1. Specifically, the controller 200 of FIG. 2 may be employed to implement functions of the processing and display controller 160. The controller 200 may also be used to implement various functions within the system 100 of FIG. 1 in which software and/or firmware functionality is described.

The controller 200 of FIG. 2 comprises a processor 230 as well as memory 240 for storing various control programs and other programs 244 and data 246. The memory 240 may also store an operating system 242 supporting the programs 244, such as the Windows® operating system manufactured by Microsoft Corporation of Redmond, Wash. Other operating systems, frameworks and environments suitable for performing the tasks described herein will also be appreciated by those skilled in the art and informed by the teachings of the present invention. For example, the various operating systems utilized by Apple Computer Corporation of Cupertino, Calif. and the various Unix-derived operating systems may also be utilized within the context of the present invention.

The processing 230 cooperates with conventional support circuitry such as power supplies, clock circuits, cache memory and the like as well as circuits that assist in executing the software routines stored in the memory 240. As such, it is contemplated that some of the steps discussed herein as software processes may be implemented within hardware, for example as circuitry that cooperates with the processor 230 to perform various steps. The controller 200 also contains input/output (I/O) circuitry 210 that forms an interface between the various functional elements communicating with the controller 200. Although the controller 200 is depicted as a general purpose computer that is programmed to perform various control functions in accordance with the present invention, the invention can be implemented in hardware as, for example, an application specific integrated circuit (ASIC) or field programmable gate array (FPGA). As such, the process steps described herein are intended to be broadly interpreted as being equivalently performed by software, hardware or a combination thereof.

The programs 244 stored within the memory 240 may include programs adapted to implement the horizontal control function 162 and vertical control function 164 provided by the processing and display controller 160. The programs 244 may also include programs adapted to provide the various user interface functions, system control functions and display/image modification functions discussed herein.

The signal acquisition system 100 of FIG. 1 generally receives signals under test (SUT) which are digitized, decimated and subsequently processed to derive respective waveforms for display. The displayed waveforms have associated with them a horizontal parameter and vertical parameter. The horizontal parameter comprises a time parameter while the vertical parameter comprises an amplitude parameter. Control circuitry is responsive to user inputs to adjust the timebase (i.e., time per horizontal division) and amplitude (i.e., volts per vertical division) of displayed waveform(s). That is, in an oscilloscope having a display device including a grid pattern, a user may select the number of volts represented by each vertical segment and the amount of time represented by each horizontal segment.

Within the context of the present invention, a duration parameter determines the length in seconds of an acquired waveform as displayed. The timebase parameters of record length or sample rate may be adjusted in order to change the duration parameter. The record length is the number of acquired samples that may be stored in a single record (e.g., within memory 150), while the sample rate is the number of samples per second acquired from a signal under test (e.g., the clock signal S produced by the timebase 180). While it is normally preferable to avoid adjusting both record length and sample rate simultaneously, where a hardware boundary limit for record length (e.g., insufficient memory for desired record length) or sample rate (e.g., desired sample rate too high or not available) is reached in response to user adjustment, it is appropriate to adjust both to stay within the hardware boundaries of the acquisition system. While the duration control is provided or "reads out" in seconds, the record length parameter is the underlying parameter controlled by a duration control. Thus, operation of the duration control may "drag" the sample rate when attainable record length boundaries are reached. In one embodiment of the invention, the sample rate and record length parameters are simultaneously adjusted to provide one of a predetermined plurality of duration parameters, such as those providing a conventional 1-2-5 scale of temporal adjustment.

Figure 3:
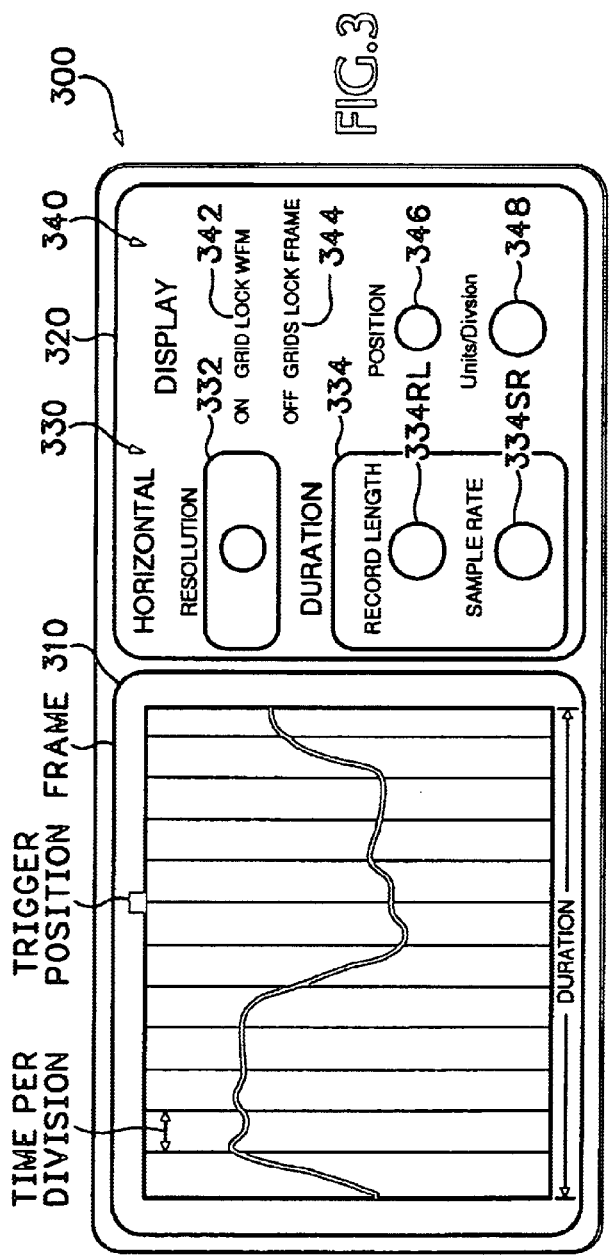
FIGS. 3–5 depict user interface screens suitable for use in an embodiment of the present invention.

FIG. 3 depicts a user interface suitable for use in an embodiment of the present invention. The user interface 300 of FIG. 3 is suitable for display on, for example, a touch screen display device such as discussed above with respect to FIG. 1. That is, the objects displayed within the context of the user interface (and its submenus) are optionally responsive to direct user manipulation to provide the various functionality described herein.

The user interface 300 of FIG. 3 comprises a waveform display region 310 and a control region 320. The waveform display region 310 displays one or more waveforms for a period of time or duration that is controlled by the user. The waveform display region 310 is depicted as comprising a plurality of vertical lines delineating discrete portions of the display time period or duration. A time per division parameter is represented by the time period between adjacent vertical lines. Also shown in the waveform display region 310 is a trigger position indicator which indicates the point in time at which trigger circuitry within an acquisition system was asserted (i.e., a trigger condition was detected or decoded). While not shown, horizontal lines delineating a volts per division parameter are normally displayed with vertical lines to form thereby a display grid. The acquired waveforms are nominally fit to the width of the waveform display region 310. The acquired waveforms are displayed with their duration adapted to fit the width of the display frame when a zoom mode is off.

The control region 320 comprises a horizontal signal acquisition control region 330 and a display control region 340. The display control region 340 comprises a grid lock to waveform (GRID LOCK WFM) control 342, a grid lock to frame control 344, a position control 346 and a units per division control 348. The grid lock to waveform control 342, when enabled, places the signal acquisition device in a first mode of operation wherein the grid lines delineating the time per division parameter are locked to waveform such that an increase in the duration parameter results in an increase in the number of such grid lines. The grid lock to frame control 344, when enabled, places the signal acquisition device in a second mode of operation wherein the vertical grid lines delineating the time per division parameter are locked to the display frame such that increases in the duration parameter do not result in an increase in such grid lines. The position control 346 enables adjustments in time or offsets of the displayed waveform. Such temporal offsets are especially useful in aligning portions of interest of a displayed waveform to grid lines to assist a user in analyzing the waveform. The units per division control 348 is used to adjust the time per division parameter.

The horizontal signal control region 330 includes a resolution control 332 and a duration control 334. The duration control 334 includes a record length control 334RL and a sample rate control 334SR.

The duration control 334 determines the length in seconds (i.e., the duration) of an acquired waveform as displayed. While this control is displayed in seconds, the record length is the underlying parameter that is controlled. Thus, the duration parameter may be changed by changing the record length (via the record length control 334RL) or sample rate (via the sample rate control 334SR). As previously noted, unless hardware boundary conditions are reached, only one of the record length and sample rate controls may be adjusted at one time by a user. The resolution control 332 determines the number of samples to be acquired during a specified duration. User operation of the resolution control 332 results in changes to both record length and sample rate.

In the first mode of operation, the grid lines are locked to the waveform. In this mode of operation, adjusting a "time per division" parameter results in the number of grids that cover an acquired waveform duration to be variable. The grids locked to the waveform mode of operation is invoked by a user selecting the "on" position of the grid lock WFM control 342. An advantage of using this control is that constraints on timebase parameters of record length and sample rate imposed by requirements for specific values of time per division on the screen are relieved. Thus, the user may now change the horizontal duration while maintaining a constant time per division on the display, which was not possible with previous oscilloscope timebase and display constraint controls. In this manner, better control of the record length parameter in the timebase is provided in order to bring more duration on screen while the number of grids increases as the time per grid is kept constant. Preferably, the reference grid is drawn at the trigger position when a "grid offset" or position control is set to zero. All other horizontal grids delineated by vertical lines are spaced with respect to this reference grid position. Adjusting the position control moves the grids with respect to the trigger position. When a display zoom function is used, the grids scale along with the waveform and maintain their same relationship with respect to the waveform. Time per division is then specified in exact 1-2-5 sequences when incrementing with a knob such as units per division control 348. However, it will be appreciated that the user may also enter time per division information through other devices such as a keypad or pointing device.

In the second mode of operation, the grids are locked to the display frame. In this mode of operation, adjusting a "time per division" parameter does not change the number of grids that cover an acquired waveform duration. This mode of operation is invoked by, for example, a user selecting the "on" position for the grid lock frame control 344. This mode allows the user to have a view of the waveform similar to current oscilloscopes but with some additional capability. Specifically, in this second mode of operation, the horizontal grid lines drawn vertically are fixed with respect to the display frame. The difference is that the user is not limited to always having ten divisions as with current oscilloscopes; rather, users may choose the number of grid lines they want and/or the time per division between grid lines. It is noted that adjusting the time per division parameter will not change the acquisition parameters. The time per division is a display grid control, not an acquisition parameter control. Only the duration and resolution controls will result in a change to acquisition parameters.

There are several techniques contemplated by the inventor for specifying the time per division (which determines the number of displayed horizontal grids). In a first technique, the number of horizontal grid lines to be drawn is specified directly by the user. This first technique in conjunction with the duration selection determines the time per division readout. When fixing the number of grid lines using this first technique, the time per division values will not always be standard values, because of the increased flexibility in record length and sample rate choices as discussed above. That is, the conventional 1-2-5 values common on oscilloscopes will not necessarily be the time per division values selected using this technique. In a second technique, the number of grids is specified by entering a specific time per division number. In this manner, very "nice" or conventional time per division grid values are attained. These grid values may comprise the conventional 1-2-5 values, or may comprise any other values desired by a user. Given this method of entry, the number of grids fixed to a frame is determined by the current duration and the requested time per division.

Figure 4:
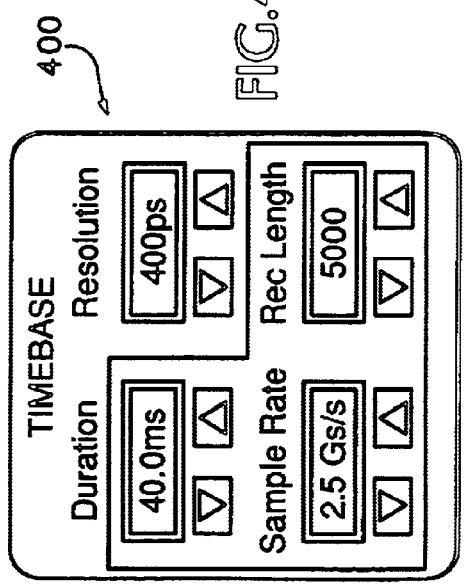

FIG. 4 depicts an exemplary user interface organization of timebase controls. The timebase submenu may be invoked by selecting one of the controls within the horizontal signal control region 330 of the user interface 300 of FIG. 3. The timebase submenu may also be selected directly or accessed via a remote computing device. Specifically, the timebase control interface 400 of FIG. 4 enables user selection of duration and resolution parameters.

A selected duration display object displays a currently selected duration (illustratively 40.0 milliseconds). Increment and decrement objects proximate the duration display object may be used to increment or decrement the selected duration. As previously noted, incrementing or decrementing the selected duration comprises incrementing or decrementing record length up to a physical boundary, at which point sample rate is adjusted to realize a desired duration.

A selected sample rate display object displays a currently selected sample rate (illustratively 2.5 gig samples per second). Increment and decrement objects proximate the sample rate display object may be used to increment or decrement the sample rate.

A selected record length display object displays the currently selected record length (illustratively 5,000 samples). Increment and decrement objects proximate the record length display object may be used to increment or decrement the selected record length.

A selected resolution display object displays the presently selected sampling resolution (illustratively 400 picoseconds between samples). Increment and decrement objects proximate the resolution display object may be used to increment or decrement the selected resolution.

Figure 5:
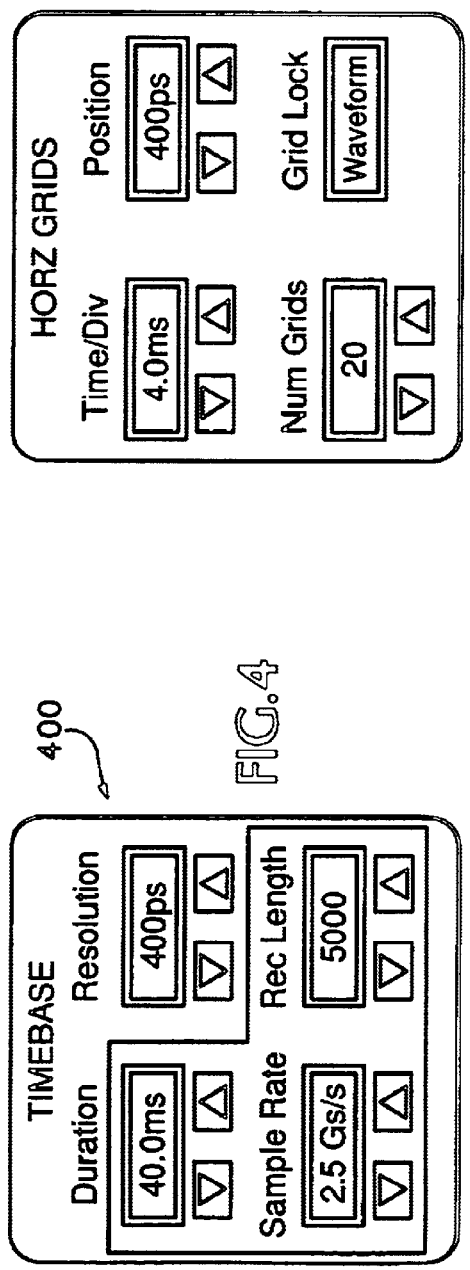

FIG. 5 depicts an exemplary user interface organization of horizontal grid controls. Specifically, the horizontal grid control interface 500 of FIG. 5 enables user selection of time per division, grid position, number of grids and grid lock mode.

A selected position or offset display object displays the grid position (illustratively 400 picoseconds) as offset from a reference position (illustratively a trigger position or edge of frame position). Increment and decrement objects proximate the position display object may be used to increase or decrease the temporal offset of the grid from the reference position.

A selected time per division display object displays a currently selected time per division (illustratively 4.0 ms). Increment and decrement objects proximate the time per division display object may be used to increment or decrement the selected time per division associated with each horizontal division.

A selected number of grids display object is used to display the presently selected number of grids (illustratively 20). Increment and decrement objects proximate the grid number display object may be used to increment or decrement the selected number of grids.

A grid lock mode indicator object is used to display the presently selected grid lock mode (illustratively WAVEFORM). As previously noted, the grid may be locked to a waveform (via control 342) or locked to a frame (via control 344). The grid may also remain unlocked.

Figure 6:
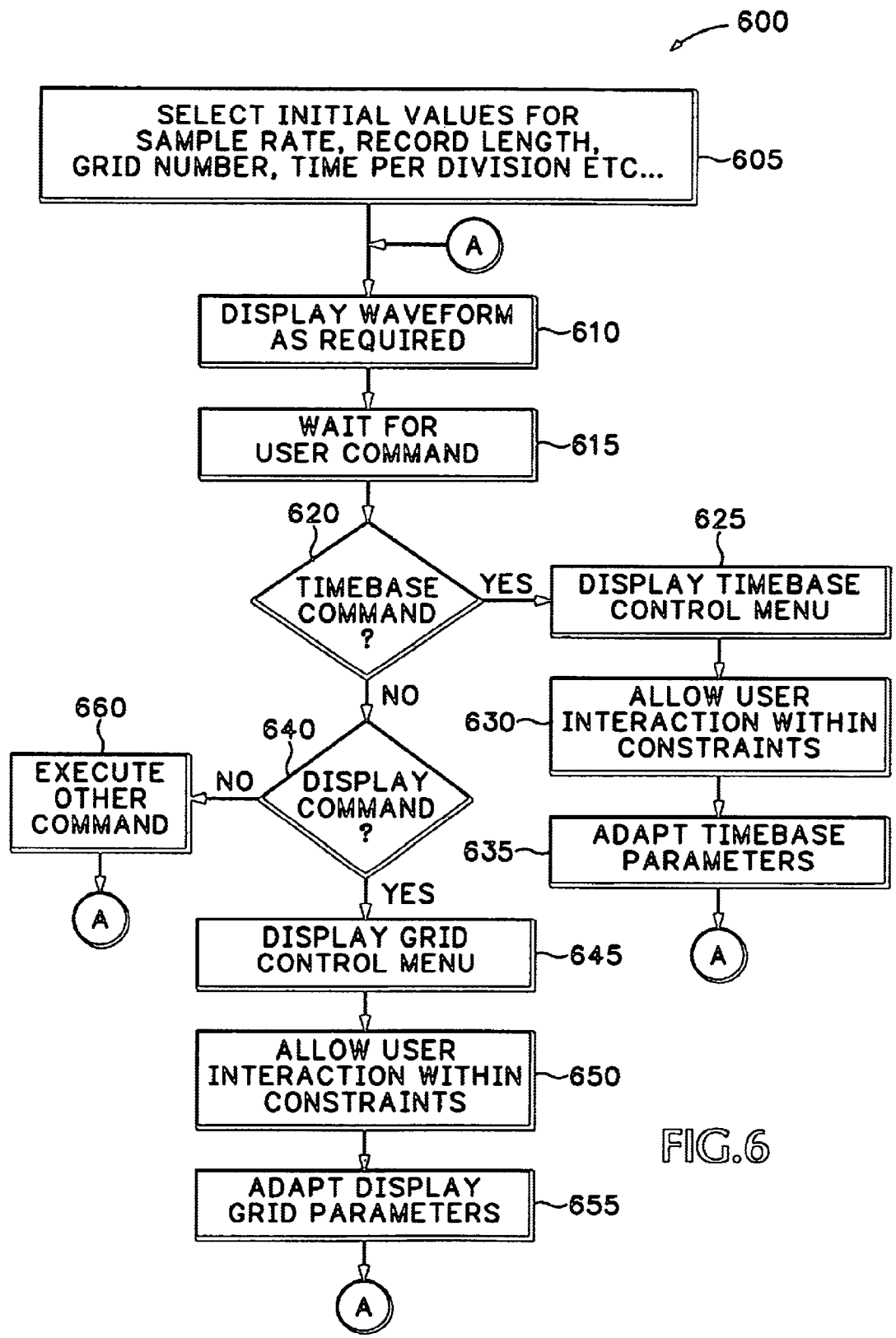
FIG. 6 depicts a flow diagram of a method according to an embodiment of the invention.

FIG. 6 depicts a flow diagram of a method according to an embodiment of the invention. The method 600 of FIG. 6 is suitable for use in the signal acquisition system 100 of FIG. 1 to provide to a user control functionality in accordance with the present invention. Specifically, the method 600 of FIG. 6 is entered at step 605 where initial values for sample rate, record length, number of grid lines, time per division and the like are selected. Step 605 may be implemented as, for example, a portion of an automatic triggering routine adapted for initially acquiring a signal under test. Step 605 may also be implemented by selecting default values or utilizing the most recent values.

At step 610, the waveform as acquired is displayed. That is, at step 610 the waveform(s) associated with one or more acquired signals under test are displayed utilizing timebase parameters and grid display parameters initially selected at step 605 or subsequently modified as discussed below with respect to steps 615–660.

At step 615, the method waits for a user command. Upon receiving a user command, at step 620 a determination is made as to whether the received user command comprises a timebase command. If the command is not a timebase command, then at step 640 the method determines whether the user command comprises a display command. If the user command is not a timebase command or display command, then at step 660 the method executes some other command (e.g., screen intensity, system setup, system configuration and the like) and returns to step 610.

In the case of a timebase command, at step 625 a timebase control menu is displayed. That is, at step 625 a user interface such as the timebase control menu discussed above with respect to FIG. 4 is displayed for user interaction. At step 630, the method allows user interaction with the timebase control menu within the various constraints discussed above. Upon the conclusion of user interaction at step 630, the method at step 635 adapts the various timebase parameters of the acquisition system 100 to those at step 630. The method then returns to step 610 to display the waveform(s) as acquired according to the new timebase parameters.

In the case of a display command, at step 645 a user interface such as the display control menu discussed above with respect to FIG. 5 is displayed for user interaction. At step 650, the method allows user interaction with the display control menu within the various constraints discussed above. Upon conclusion of the user interaction at step 650, the method at step 655 adapts the various display parameters of the acquisition system 100 to those selected at step 650. The method then returns to step 610 to display the waveform(s) as acquired according to the new display parameters.

The following examples demonstrate how control of the various parameters affects the waveform, frame and grid display. These are cases where the grids are fixed with respect to the horizontal trigger position and are independent of the display frame (i.e., the grids are locked to the waveform).

Figure 7A:
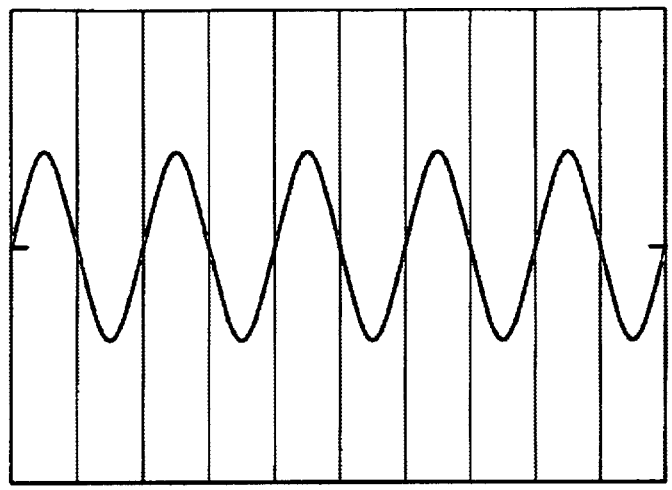
FIGS. 7A–7C depict graphical representations of waveforms useful in understanding the present invention.

FIG. 7A depicts an exemplary display of a sine wave function having a period of 2 nanoseconds that is displayed at a duration (D) of 10 nanoseconds (i.e., 5 complete cycles) and at a time per division (t/d) of 1 nanosecond per division. The display of FIG. 7A depicts grid position and spacing adapted to align each zero crossing of the sine wave with a corresponding grid line. Such display is extremely useful for analyzing jitter over long record lengths where thousands of grids may be used.

Figure 7B:
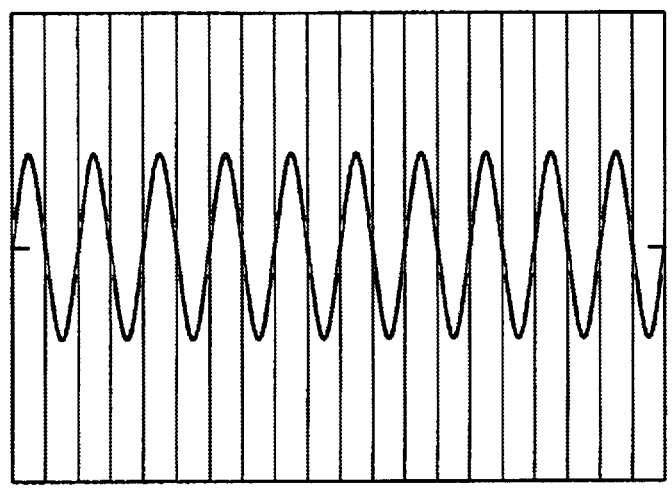

FIG. 7B depicts the sine wave function of FIG. 7A displayed with a duration (D) of 20 nanoseconds and a time per division (t/d) of 1 nanosecond per division. FIG. 7B represents the display of FIG. 7A as modified by user adjustment of the duration parameter from 10 nanoseconds to 20 nanoseconds. Since the time per division parameter is not changed, and since the grid lock to waveform mode (mode 1) is asserted, twice as many grids are now displayed (i.e., the reference of grids with respect to signal does not change). This means that the grids are still in the same position with respect to the waveform in both FIGS. 7A and 7B, where FIG. 7B displays twice as many cycles because the duration is double that of FIG. 7A.

Figure 7C:
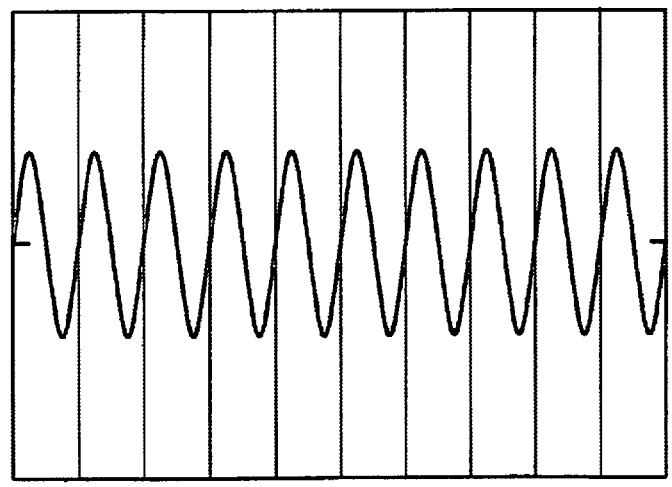

FIG. 7C depicts the sine wave function of FIGS. 7A and 7B displayed with a duration (D) equal to 20 nanoseconds and a time per division (t/d) equal to 2 nanoseconds per division. Specifically, the display of FIG. 7C represents the change from the display of FIG. 7B as modified by a user adjustment of the time per division function from 1 nanosecond per division to 2 nanoseconds per division. While the relationship of the waveform to the display frame does not change, the number of grids is reduced by half.

Any of the displays of FIG. 7 may be modified by user adjustment of a grid offset or position control which allows the grids to be horizontally moved on the waveform with respect to the trigger position.

The above-described invention advantageously provides a means to unify the control of primary horizontal acquisition parameters of record length and sample rate in terms of higher level user interface parameters of duration and resolution, as well as in terms of the display parameters of units per division or number of grids. When the grids are locked to the waveform, they will scale with the waveform when a zoom function is in use. The invention operates to relieve design constraints on oscilloscope or other signal acquisition device designers to allow a much larger choice of possible sample rates and record lengths within the oscilloscope or signal acquisition system timebase while still allowing for a relatively straight forward implementation of the improved timebase model represented by the duration and resolution controls discussed herein.

The above-described invention also provides a new way to implement a time per division control that facilitates the relaxing of constraints previously imposed on the choices of record length and sample rate in data acquisition devices. The addition of this control to a system allows for a choice of relatively "nice" or conventional numbers for time per grid while allowing essentially continuous adjustment of record length by modulo increments of the display width or even down to the nearest sample interval. In addition, a much larger choice of sample rates can also be made available while maintaining the nice or conventional time per grid settings. This makes it possible to provide sample rate and record length control independent of each other yet still constrained within the duration and resolution control model of a signal acquisition device. The invention may be implemented within the context of spectrum analyzers, optical reference receivers, disk drive measurement devices and the like. Thus, the invention has broad applicability to both general purpose and specialized test and measurement instrumentation.

While the foregoing is directed to the preferred embodiment of the present invention, other and further embodiments of the invention may be devised without departing from the basic scope thereof, and the scope thereof is determined by the claims that follow.

What is claimed is:

1. Apparatus, comprising:
    a signal acquisition device, for sampling a signal under test (SUT) at a sample rate S to form thereby a stream of acquired samples;
    a memory, for storing sequences of said acquired samples as corresponding sample records, each sample record having associated with it a duration parameter; and
    a controller, for generating a display signal suitable for use by a display device and including waveform imagery visually cooperating with temporal segment delineators;
    said controller, in a first mode of operation, adapting a number of temporal segment delineators in response to said duration parameter.

2. The apparatus of claim 1, wherein:
    in response to user input indicative of a new duration parameter, said controller in said first mode of operation adjusts the number of samples used to form each sample record.

3. The apparatus of claim 2, wherein:
    in the case of said adjusted number of samples exceeding a threshold level, said controller in said first mode of constrains the number of samples used to form each sample record to said threshold level and adjusts the sample rate S.

4. The apparatus of claim 1, wherein:

in response to user input indicative of a new sample rate parameter, said controller in said first mode of operation adjusts the number of samples used to form each sample record.

5. The apparatus of claim 4, wherein:

in the case of said adjusted number of samples exceeding a threshold level, said controller in said first mode of constrains the number of samples used to form each sample record to said threshold level and adjusts the number of samples used to form each sample record.

6. The apparatus of claim 1, wherein:

said controller, in said first mode of operation, operates to lock an initial portion of said waveform imagery to an initial temporal segment delineator.

7. The apparatus of claim 6, wherein:

in response to user input indicative of a new duration parameter, said controller adjusts the number of samples used to form each sample record and scales the number of temporal segment delineators according to the ratio of the new and existing duration parameters.

8. The apparatus of claim 1, wherein:

in response to user input indicative of a desired number of temporal segment delineators, segmenting said waveform imagery into said desired number of temporal segments.

9. The apparatus of claim 1, wherein:

said controller, in a second mode of operation, adapting a number of temporal segment delineators in response to user input indicative of a desired number of temporal segment delineators.

10. The apparatus of claim 2, wherein:

said sample rate and record length parameters are simultaneously adjusted to provide one of a predetermined plurality of duration parameters.

11. An oscilloscope, comprising:

signal acquisition circuitry for acquiring a plurality of samples of at least one signal under test (SUT) in response to at least one timebase control signal;

signal display circuitry for displaying at least a portion of said acquired samples and a corresponding display grid; and a controller, for modifying said at least one timebase control in response to a first user command, and for modifying said display grid in response to a second user command; wherein:

said display grid modification comprises at least one of modifying a number of temporal grid lines and selecting a time per temporal grid line.

12. The oscilloscope of claim 11, wherein said timebase control modification causes a change in at least one of a sample rate parameter and a record length parameter of said acquisition circuitry.

13. The oscilloscope of claim 11, wherein:

wherein said sample rate and record length parameters are simultaneously adjusted to provide one of a predetermined plurality of duration parameters.

* * * * *